United States Patent [19]
Hawkins et al.

[11] Patent Number: 5,583,454
[45] Date of Patent: Dec. 10, 1996

[54] PROGRAMMABLE INPUT/OUTPUT DRIVER CIRCUIT CAPABLE OF OPERATING AT A VARIETY OF VOLTAGE LEVELS AND HAVING A PROGRAMMABLE PULLUP/PULLDOWN FUNCTION

[75] Inventors: Keith G. Hawkins, Dripping Springs; Harikumar B. Nair, Austin; Shivachandra I. Javalagi, Austin; Kuok Y. Ling, Austin, all of Tex.

[73] Assignee: Advanced Micro Devices, Inc., Sunnyvale, Calif.

[21] Appl. No.: 566,131

[22] Filed: Dec. 1, 1995

[51] Int. Cl.$^6$ ............................................. H03K 19/0175
[52] U.S. Cl. ................................ 326/81; 326/50; 326/121
[58] Field of Search .................................. 326/80, 81, 49, 326/50, 37, 87, 121

[56] References Cited

U.S. PATENT DOCUMENTS

| | | | |
|---|---|---|---|
| 5,097,149 | 3/1992 | Lee | 326/87 |
| 5,175,445 | 12/1992 | Kinugasa | 326/87 |
| 5,410,267 | 4/1995 | Haycock et al. | 326/81 |
| 5,465,054 | 11/1995 | Erhart | 326/81 |
| 5,477,172 | 12/1995 | Schnizlein | 326/81 |
| 5,479,116 | 12/1995 | Sallaerts | 326/81 |

*Primary Examiner*—Edward P. Westin
*Assistant Examiner*—Andrew Sanders
*Attorney, Agent, or Firm*—Kevin L. Daffer; Conley, Rose & Tayon

[57] ABSTRACT

An integrated circuit is presented having a driver circuit programmable to produce a variety of output voltages and conductive to the voltage levels of circuits interfaced by the integrated circuit. The integrated circuit includes programmable pullup and pulldown functions. The integrated circuit may be configured into an application having devices powered by a power supply voltage which is substantially larger than the voltage supplying the core section of the integrated circuit. Additionally, the present integrated circuit may be configured into other applications having devices powered by a power supply voltage substantially similar to the voltage supplying the integrated circuit core section. The present integrated circuit therefore retains utility for a large variety of applications. The pullup and pulldown transistors may be programmed to provide a resistive one, resistive zero, or neither.

34 Claims, 5 Drawing Sheets

PROGRAMMABLE INPUT/OUTPUT DRIVER CIRCUIT CAPABLE OF OPERATING AT A VARIETY OF VOLTAGE LEVELS AND HAVING A PROGRAMMABLE PULLUP/PULLDOWN FUNCTION

BACKGROUND OF THE INVENTION

1. Field of the Invention

This invention is related to the field of driver and receiver circuits on an integrated circuit, wherein the driver and receiver circuits are capable of receiving and driving a higher voltage than the voltage supplying the integrated circuit core. The driver circuit includes programmable pullup and pulldown transistors capable of driving a voltage higher than the voltage supplying the integrated circuit core or, in the alternative, driving a voltage substantially equal to the voltage supplying the integrated circuit core.

2. Description of the Relevant Art

Integrated circuits are used in a wide variety of applications including computer systems, personal information devices such as cellular phones and electronic organizers, and automobile electronic control systems. As used herein, the term "integrated circuit" refers to any electronic device which embodies a predetermined set of functions upon a single monolithic substrate.

Integrated circuits may be fabricated in different semiconductor technologies. The selection of a particular semiconductor technology with which to fabricate a particular integrated circuit depends on many factors. The semiconductor technologies available when designing the particular integrated circuit in many ways dictate how the circuit will perform. The cost involved in fabricating the integrated circuit also determines circuit operability given the limited resources in many wafer fabrication sites. Considerations related to the application for which the integrated circuit is designed, such as operable temperature ranges and power consumption constraints imposed by circuit application may also affect the choice of semiconductor technology.

Complimentary metal-oxide-semiconductor (CMOS) technology is a particularly popular semiconductor technology for many applications. Two types of transistors may be formed in a CMOS process: PMOS transistors and NMOS transistors. PMOS transistors and NMOS transistors have four terminals (or connection points): a gate terminal, a source terminal, a drain terminal, and a bulk terminal. Electric current flows from the source terminal to the drain terminal of a transistor when a voltage applied to the gate terminal has either a higher or lower value than the voltage applied to the source terminal, depending on the transistor type. A PMOS transistor is a transistor in which current flows if the voltage applied to the gate terminal is lower than the voltage applied to the source terminal. An NMOS transistor is a transistor in which current flows if the voltage applied to the gate terminal is higher than the voltage applied to the source terminal. The bulk terminal is connected either to the source terminal or to a proper bias voltage.

In both the PMOS transistor and NMOS transistor, the difference in voltage between the gate terminal and the source terminal must be larger in absolute value than a certain voltage before current flow begins. This certain voltage is referred to as a "threshold" voltage and is the voltage required to form an energized channel between the source and the drain diffusion regions in the PMOS transistor or NMOS transistor. As will be appreciated by those skilled in the art, a transistor is formed on a substrate by diffusing impurities into two regions (a drain diffusion region and a source diffusion region). The two regions are separated by a distance of undiffused substrate material called a channel, over which the gate terminal is constructed. By applying a voltage to the gate terminal of the transistor, the channel is energized such that current may flow between the source diffusion region and the drain diffusion region.

A particular CMOS semiconductor technology requires a relatively narrow range of power supply voltages to operate properly. If a power supply voltage lower than the specified range is used, transistors may not be capable of developing voltage levels large enough to cause significant current flow through the transistors. If a power supply voltage higher than the specified range is used, many problems may occur. Among such problems are "hot carrier effects" which may cause damage to transistors. Carriers are electrons or holes which flow through the channel region of a transistor when it is energized via a voltage difference between the gate terminal and the source terminal of the transistor. Hot carrier effects may be generated in two ways. First, substrate hot carriers are generated as a result of large voltage differences between the gate terminal and the bulk terminal of a transistor. Carriers are generated in the bulk and accelerate across the channel. If the voltage difference is large enough, the carriers may inject into the oxide layer between the gate conductor and the silicon surface. Second, channel hot carriers originate from channel current and impact ionization current near the drain junction. Carriers may gain sufficient energy to inject into the aforementioned oxide. Carriers embedded in the oxide cause the threshold voltage of the transistor to shift, reducing current capability of the transistor. Another problem associated with voltages higher than the specified range is oxide breakdown. When oxide breakdown occurs, an electrical short is created between the gate terminal and the source terminal, the drain terminal, or the channel.

Modern integrated circuits are being fabricated in CMOS semiconductor technologies having power supply voltage ranges lower than previously developed CMOS semiconductor technologies. Voltage ranges are decreasing due to the shrinkage of transistor geometries as CMOS semiconductor technologies improve. Shrinking geometries allow more transistors to be placed within a given area of a semiconductor substrate. Thus, more functionality may be included within a particular area of substrate used to manufacture an integrated circuit. As transistor geometries shrink, the voltage that the transistors are capable of withstanding decreases as well. For example, a shorter channel and a thinner oxide imply that a lower voltage applied across the gate oxide may induce hot carrier effects and cause oxide breakdown.

Modern integrated circuits are required to interface to older integrated circuits in many applications. For example, computer systems use a mix of integrated circuits implemented in different semiconductor technologies. Some of these integrated circuits require a nominal power supply voltage of 5.0 volts. Other integrated circuits are fabricated in semiconductor technologies requiring a nominal power supply voltage of 3.3 volts. A "nominal" power supply voltage is the power supply voltage at which the transistors embodied in the particular semiconductor technology provide optimal performance and reliability. Typically, the actual power supply may vary higher or lower than the nominal value by some percentage defined by the semiconductor manufacturer. A 5% to 10% variation from the nominal value is typically allowed. Therefore, a maximum allowable voltage level can be defined with respect to a particular semiconductor technology. The maximum allowable voltage is slightly above the allowable variation from the nominal power supply value.

A particularly difficult problem with interfacing integrated circuits requiring dissimilar nominal power supply voltages is handling the higher voltages that the 5.0 volt integrated circuits produce on interface buses to which 3.3 volt integrated circuits are connected. Typically, CMOS integrated circuits produce voltages on their output pins which are substantially equal to the power supply voltage if the pin is conveying a logical one value. Therefore, 5.0 volt integrated circuits may drive a 5.0 volt signal onto an interface bus. A 5.0 volt signal connected directly to an integrated circuit with a nominal power supply voltage of 3.3 volts would cause hot carrier effects and/or oxide breakdown to occur in the receiving integrated circuit. It would be advantageous for integrated circuits with a 3.3 volt power supply to be able to receive 5.0 volt input signals and drive 5.0 volt output signals without sustaining damage to the integrated circuit.

A 3.3 volt operable integrated circuit with 5.0 volt input/output capabilities could be of even further benefit if it could achieve selectable power conservation. Such an integrated circuit conserves power if it is capable of driving output signals at 3.3 volts when employed in an application not utilizing 5.0 volt integrated circuits. Accordingly, an advantage is gained by having an integrated circuit, if called upon, can receive and output 5.0 volt signals; however, if not called upon, the integrated circuit will receive and output 3.3 volt signals. Such an integrated circuit would be useful as an interface circuit which can programmably select its input and output voltage levels to achieve optimal power usage.

It would be desirable for such an integrated circuit to be programmably configurable, for example, via a programmable pullup and pulldown function to pull up or pull down interface buses when they are not in use. The pullup function would charge the conductors of a bus to the power supply voltage level (e.g. 3.3 volts or 5.0 volts). The pulldown function would discharge the conductors of a bus to the ground voltage level. The desired pullup or pulldown features would serve to conserve power in applications where the bus is idle for long periods of time. Taking advantage of CMOS principles whereby CMOS circuits consume minimal power when their inputs are at power supply or ground voltage levels, the desired integrated circuit must include programmed units which provide power and ground voltages at CMOS inputs via pullup and pulldown functions. The desired pullup and pulldown functions would be resistive, such that the pullup or pulldown functions consume little power during the drive phase.

SUMMARY OF THE INVENTION

The problems outlined above are in large part solved by an integrated circuit employing a driver circuit according to the present invention. The present driver circuit is programmable to produce a variety of output voltages including the voltage supplying the core section of the integrated circuit and a second voltage supplied by the application into which the integrated circuit is configured. The integrated circuit hereof is suitably adapted for powering input devices with a power supply voltage substantially larger than the voltage supplying the core section of the integrated circuit. Additionally, the integrated circuit may provide an interface powered by a power supply voltage substantially similar to the voltage supplying the integrated circuit core section. The latter is used to achieve performance increases and power savings over applications employing older integrated circuits or circuits utilizing a higher power supply voltage (e.g. 5.0 volts instead of 3.3 volts). The present integrated circuit therefore retains utility for a large variety of applications.

The present driver circuit is additionally configured with programable pullup and pulldown transistors. The pullup and pulldown transistors may be programmed to provide a resistive one, resistive zero, or neither. Advantageously, power may be saved in applications which did not previously implement pullup or pulldown devices. The buses connecting the electrical devices of a system will be driven to a particular value when idle. Therefore, receiver circuits attached thereto will switch with respect to the input value and remain in steady state until the bus becomes active again.

Broadly speaking, the present invention contemplates an output driver circuit for producing an output voltage programmable to a pair of output voltage levels. The output driver circuit comprises a power supply conductor, an output conductor, a driving transistor, a first transistor, an isolation transistor, a reference voltage conductor and a first conductor. The power supply conductor is powered, during use, to a power supply voltage, and the driving transistor is coupled thereto. The first transistor is coupled in parallel with the driving transistor. Coupled to the output conductor, the isolation transistor is series-connected to the parallel-connected transistors. The gate terminal of the isolation transistor is coupled to the reference voltage conductor which is powered, during use, to a reference voltage. Coupled to the gate terminal of the first transistor, the first conductor is selectively powered, during use, to one of a pair of voltages.

The present invention further contemplates an input/output driver circuit for receiving an input voltage and driving an output voltage. The input and output voltages are programmable to a pair of voltages. The input/output driver circuit comprises an input/output conductor, an output driver circuit, an input receiver circuit, first and second level translator circuits, and a selection circuit. The output driver circuit and the input receiver circuit are coupled to the input/output conductor. Configured to drive the output voltage, the output driver circuit is selectively powered, during use, with one of a pair of power supply voltages. The input receiver circuit receives the input voltage. The first level translator circuit is configured to translate an input signal upon the first level translator circuit having a voltage swing between a first voltage and a second voltage to a second signal having a voltage swing between the first voltage and a third voltage. Coupled to receive both the input signal and the second signal is the selection circuit, which is configured to select between the two signals and to convey a selected signal to the second level translator circuit. The second level translator circuit receives the selected signal and is configured to translate the selected signal to a third signal having a voltage swing between one of the pair of power supply voltages and the third voltage. Additionally, the second level translator circuit is configured to convey the third signal to the output driver circuit.

The present invention still further contemplates an integrated circuit comprising a core section and an input/output section. The core section is configured to perform a predetermined set of functions. Coupled to the core section, the input/output section includes a plurality of output driver circuits. Each of the output driver circuits includes first and second driving transistors, first and second isolation transistors, and a pullup transistor. Additionally, each of the output driver circuits includes a power supply conductor, a ground conductor, an output conductor, and first and second reference voltage conductors. The power supply conductor is powered, during use, to one of a pair of power supply voltages. Similarly, the ground conductor is powered, during use, to a ground voltage. The first driving transistor is coupled to the power supply conductor, and the pullup transistor is coupled in parallel with the first driving transistor. Series-connected to these transistors is the first isolation transistor, which is additionally coupled to the output conductor. The second isolation transistor and the second driving transistor are series coupled between the output conductor and ground. Both the first and second isolation transistors have their gate terminals connected to the respective first and second reference voltage conductors. Each reference conductor is powered, during use, to a respective reference voltage. Additionally, the pullup transistor has its gate terminal coupled to the pullup conductor which is powered, during use, with one of a pair of pullup voltages.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
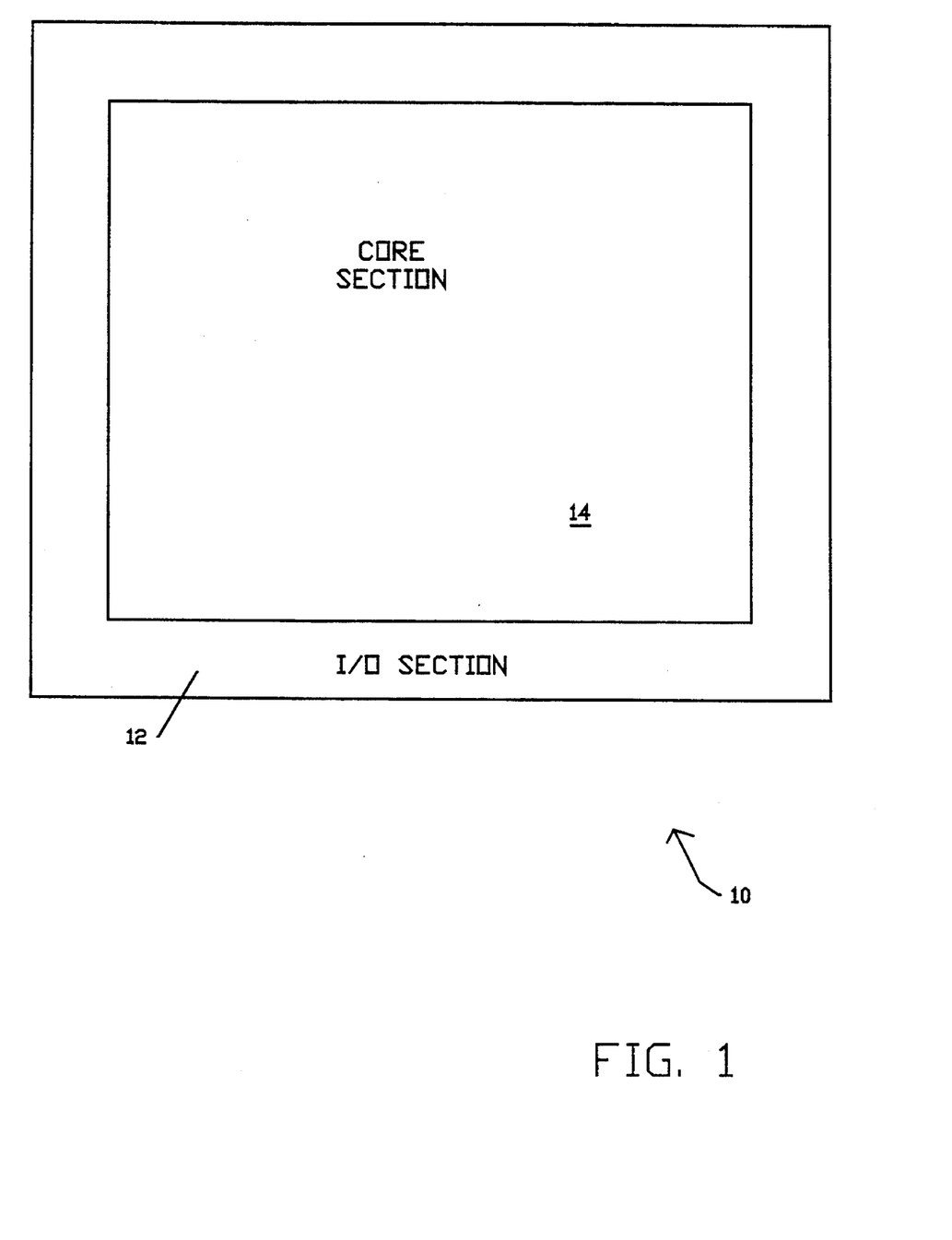
FIG. 1 is a block diagram of an integrated circuit including a core section and an input/output section according to the present invention.

Turning now to FIG. 1, a block diagram of a typical integrated circuit 10 is shown. Integrated circuit 10 is divided into a core section 14 and an input/output (I/O) section 12. Core section 14 contains circuits which implement the predetermined set of functions which integrated circuit 10 embodies. I/O section 12 contains circuits configured to effect communication between core section 14 and other integrated circuits and electrical devices to which integrated circuit 10 may be connected. Circuits within I/O section 12 include input receiver circuits, output driver circuits, and input/output driver circuits.

Input receiver circuits are configured to receive communicative signals from other integrated circuits and electrical devices. Input receiver circuits serve as a buffer to protect circuits within core section 14 from relatively large voltage levels that may occur at inputs to integrated circuit 10. Also, signals received by receiver circuits tend to have slow rise and fall times associated with them. The term "rise time" refers to an interval of time during which a signal transitions from a low voltage level to a high voltage level. The term "fall time" refers to an interval of time during which a signal transitions from a high voltage level to a low voltage level. Digital circuits operate more efficiently when they receive signal inputs having fast rise and fall times, and so the input receiver circuits convert the slow rise and fall time input signals to a fast rise and fall time signal suitable for circuits within core section 14.

Output driver circuits are configured to "drive" (i.e. transfer) communicative signals from core section 14 to integrated circuits and electrical devices connected to integrated circuit 10. Output driver circuits provide the relatively large amount of current necessary to charge the relatively large capacitances associated with external connections between electrical devices. Therefore, transistors within core section 14 need not be capable of relatively high current levels and may instead be configured to drive the relatively smaller capacitances associated with internal connections of integrated circuit 10. Output driver circuits also serve to buffer circuits within core section 14 from external voltages and currents, similar to receiver circuits.

Input/output driver circuits within i/o section 12 are configured to both drive and receive (i.e. interface) communicative signals from core section 14 to integrated circuits and electrical devices connected to integrated circuit 10. Circuits within core section 14 and other integrated circuits and electrical devices utilize a predetermined protocol for determining when a device may drive communicative signals which operate as both input and output signals. The predetermined protocol guarantees that no two integrated circuits or electrical devices drive a particular input/output signal simultaneously.

Figure 2:
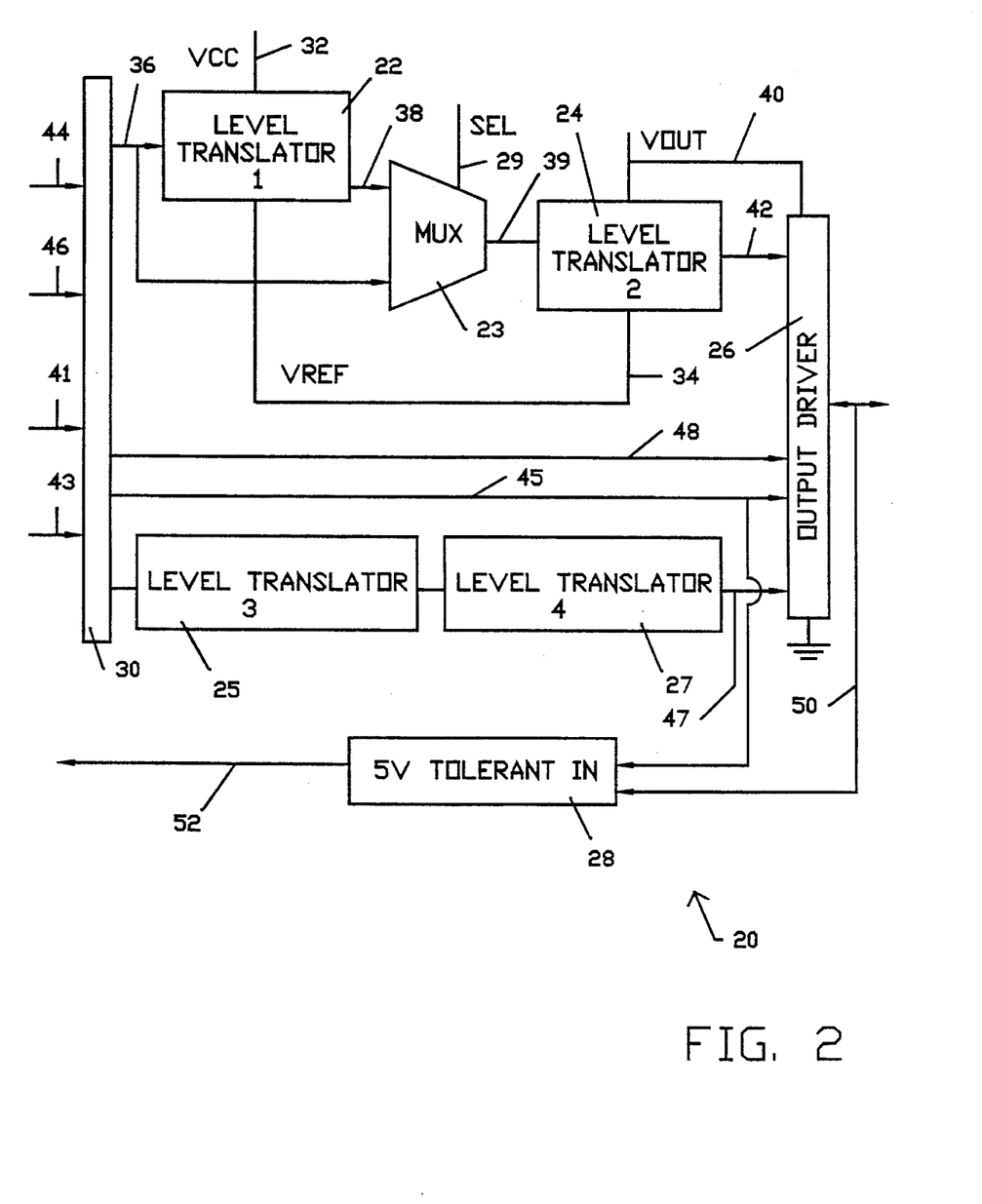
FIG. 2 is a block diagram of an input/output driver circuit employed within the input/output section of FIG. 1 according to the present invention.

Turning now to FIG. 2, a block diagram of an input/output driver circuit 20 used in I/O section 12 of integrated circuit 10 is shown. Input/output driver circuit 20 contains a first level translator circuit 22, a selection circuit 23, a second level translator circuit 24, a third level translator circuit 25, a fourth level translator circuit 27, an output driver circuit 26, an input receiver circuit 28, and a combinatorial circuit 30. Input/output driver circuit 20 may be modified to create an input receiver circuit by removing all elements except for input receiver circuit 28. Input/output driver circuit 20 may be modified to create an output driver circuit by removing input receiver circuit 28.

First level translator circuit 22 is configured with two power conductors. A first power conductor 32 is coupled to a power source (VCC) which supplies power during use to core section 14 of integrated circuit 10. In one embodiment, VCC is 3.3 volts. A second power conductor 34 is coupled to another power source which supplies a reference voltage (Vref) during use. In one embodiment, Vref is programmable to be either 1.7 volts or a ground voltage level. Vref is 1.7 volts if the output voltage produced by output driver circuit 26 may be 5.0 volts, and is the ground voltage level if the output voltage is limited to the VCC voltage level. The Vref voltage may be programmed by selecting from a pair of reference voltages via a selection circuit similar to selection circuit 23.

First level translator circuit 22 is designed to translate a pair of signals on an input bus 36 which have a "voltage swing" between ground and VCC into a pair of signals on intermediate bus 38 which have a voltage swing between Vref and VCC. The translation is effected such that a ground voltage on input bus 36 is converted into a Vref voltage on intermediate bus 38, and such that a VCC voltage on input bus 36 is converted into a VCC voltage on intermediate bus 38. Voltages between VCC and ground on input bus 36 are converted to voltages between VCC and Vref on intermediate bus 38. As used herein, the term "voltage swing" refers to a range of voltages which a signal may assume.

Second level translator circuit 24 is similarly coupled to a pair of power supply conductors. A third power supply conductor 40 is coupled to a third power source which supplies a voltage Vout during use. Vout is the output voltage which output driver circuit 26 produces when driving a high value onto an output pin. In one embodiment, Vout is programmable to a pair of power supply voltages. Vout may be 5.0 volts or 3.3 volts. Second level translator circuit 24 is also coupled to second power conductor 34, a second intermediate bus 39, and a first driver input conductor 42.

Selection circuit 23 is a multiplexor in the embodiment shown as FIG. 2. Inputs to selection circuit 23 are intermediate bus 38 and input bus 36. Selection circuit 23 is configured to select between the signals conveyed on intermediate bus 38 and input bus 36 according to a select signal. The select signal is conveyed on a selection conductor 29, and is indicative of which of the pair of power supply voltages is powering third power supply conductor 40. If Vout is not substantially equal to VCC, then the selection signal is such that intermediate bus 38 is selected. If Vout is substantially equal to VCC, then the selection signal is such that input bus 36 is selected. The input signals selected by selection circuit 23 are conveyed on second intermediate bus 39. Selection circuit 23 is provided to improve the response time from combinatorial circuit 30 indicating via input bus 36 that a high value is desired on input/output conductor 50 to the occurrence of that high value on input/output conductor 50. Level translator circuits such as first level translator circuit 22 are often slow to respond, and so circumventing first level translator circuit 22 when no voltage translation is needed improves response time.

Second level translator circuit 24 is configured to translate a voltage on second intermediate bus 39 (which conveys signals having a voltage swing between either VCC and Vref or VCC and ground) to a signal on first driver input conductor 42 having a voltage swing between Vout and Vref. A voltage of Vref on second intermediate bus 39 is converted to a voltage of Vref on first driver input conductor 42. A voltage of VCC on second intermediate bus 39 is converted to a voltage of Vout on first driver input conductor 42. Voltages between VCC and Vref on second intermediate bus 39 are converted to corresponding voltages between Vout and Vref on first driver input conductor 42.

In one embodiment, input bus 36, intermediate bus 38, and second intermediate bus 39 each are a pair of conductors upon which a single logical value and its logically inverted value are conveyed. In other words, when a relatively high voltage is conveyed on one of the pair of conductors, a relatively low voltage is conveyed on the other of the pair of conductors.

Combinatorial circuit 30 is configured to generate voltages on input bus 36 and a second voltage on a second driver input conductor 48 dependent on the values of a signal on a data conductor 44 and a signal on an enable conductor 46. Data conductor 44 and enable conductor 46 are coupled to circuits within core section 14 (shown in FIG. 1). Data conductor 44 conveys a value which core section 14 requires to communicate to another electrical device connected to integrated circuit 10. Enable conductor 46 conveys a value which indicates whether or not the value on data conductor 44 should be communicated. In one embodiment, a logical zero (represented by a ground voltage) on enable conductor 46 indicates the value on data conductor 44 should be communicated, and a logical one (represented by a VCC voltage) on enable conductor 46 indicates the value on data conductor 44 should not be communicated. In one embodiment, a logical zero is conveyed on the non-inverted conductor of input bus 36 if data conductor 44 conveys a logical one and enable conductor 46 conveys a logical zero, and a logical one is conveyed for other combinations of values on data conductor 44 and enable conductor 46. Additionally, a logical one is conveyed on second driver input conductor 48 if both data conductor 44 and enable conductor 46 convey a logical zero, and a logical zero is conveyed on second driver input conductor 48 for other combinations of values on data conductor 44 and enable conductor 46.

Additionally, a pullup signal conveyed on a pullup conductor 41 and a pulldown signal conveyed on a pulldown conductor 43 are coupled to combinatorial logic 30. If the pullup signal is active, then input/output driver circuit 20 is programmed to provide a "resistive one" upon input/output conductor 50. A resistive one refers to the conveyance of a Vout voltage by output driver circuit 26 when output driver circuit 26 is otherwise inactive (as indicated by the signals conveyed on first and second driver input conductors 42 and 48). The current-producing capability of output driver circuit 26 in the resistive one state is relatively low, such that if another driver circuit (not shown) coupled to input/output conductor 50 attempts to drive input/output conductor 50 to a ground voltage, it will be able to do so despite the resistive one of output driver circuit 26. If the pulldown signal is active, then output driver circuit 26 is programmed to provide a "resistive zero" on input/output conductor 50. A resistive zero is similar to a resistive one except that a ground voltage is conveyed instead of a Vout voltage when output driver 26 is otherwise inactive.

The pulldown signal conveyed on pulldown conductor 43 is reflected by combinatorial logic 30 into a signal conveyed upon pulldown enable conductor 45 coupled to output driver circuit 26. The pullup signal is reflected to a pullup enable conductor 47 as well. However, since the pullup signal may enable a pullup to a voltage above VCC (if Vout is programmed to be greater than VCC), the pullup signal is first translated from a signal having a voltage swing between VCC and ground to a signal having a voltage swing between Vout and Vref. Third and fourth level translators 25 and 27 provide this translation, similar to the function of first and second level translators 22 and 24. The pullup and pulldown signals are produced by core section 14 of integrated circuit 10 (shown in FIG. 1), and are activated according to the requirements of a system into which integrated circuit 10 is configured. It is noted that the pullup and pulldown enable signals conveyed upon conductors 47 and 45 (respectively) are deactivated during times in which output driver circuit 26 is actively driving a high or low value. It is further noted that a method of programming the pullup and pulldown signals is disclosed in the commonly assigned, co-pending patent application entitled: "Device and Method for Programming High Impedance States upon Select Input/Output Pads" by Hawkins, et al, filed concurrently herewith, the disclosure of which is incorporated herein by reference in its entirety.

Output driver circuit 26 is configured to produce an output signal between Vout and ground on input/output conductor 50. Output driver circuit 26 produces a voltage of Vout when a voltage of Vref is conveyed on first driver input conductor 42, and a ground voltage level when a voltage of VCC is conveyed on second driver input conductor 48. Output driver circuit 26 will be described in more detail below with respect to FIG. 4. Input receiver circuit 28 is coupled between input/output conductor 50 and a received input conductor 52. Input receiver circuit 28 receives voltages between ground and Vout on input/output conductor 50 and produces a signal on received input conductor 52 corresponding to the voltage received on input/output conductor 50. Particularly, a voltage of Vout on input/output conductor 50 results in a voltage of VCC on received input conductor 52. A ground voltage level on input/output conductor 50 results in a ground voltage level on received input conductor 52. Received input conductor 52 is coupled to circuits within core section 14 (shown in FIG. 1) which interpret the voltages conveyed on received input conductor 52.

Figure 3:
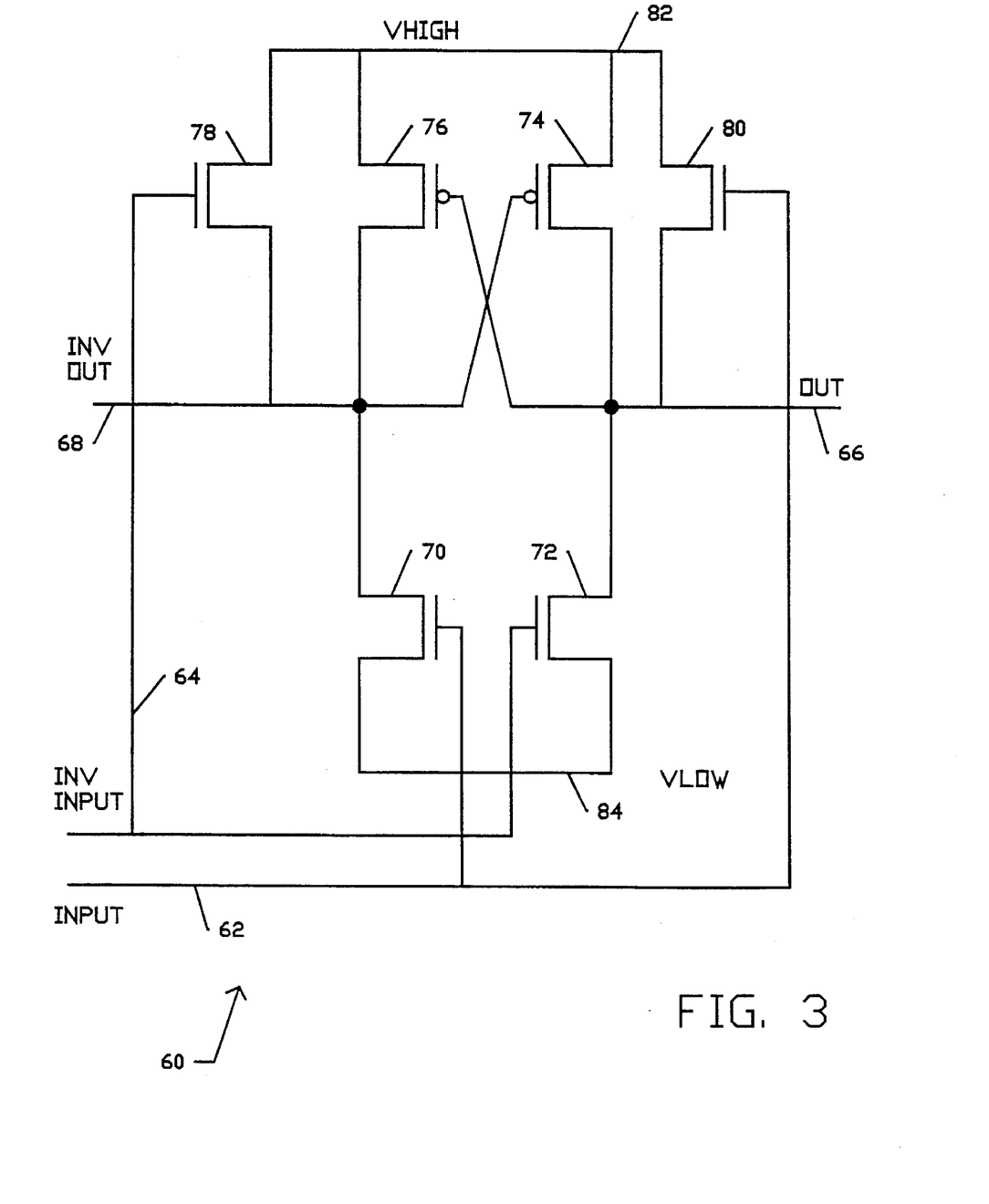
FIG. 3 is a circuit diagram of a level translator circuit according to the present invention.

Turning now to FIG. 3, an embodiment of a level translator circuit 60 that may be used as first level translator circuit 22 or second level translator circuit 24 is shown. Level translator circuit 60 is configured with an input conductor 62, an inverted input conductor 64, an output conductor 66, and an inverted output conductor 68. Level translator circuit 60 consists of six transistors 70, 72, 74, 76, 78, and 80. Transistors 70, 72, 78, and 80 are NMOS transistors, while transistors 74 and 76 are PMOS transistors. Two power conductors are provided for level translator circuit 60: a Vhigh power conductor 82 and a Vlow power conductor 84. Vhigh power conductor 82 is powered to a Vhigh voltage during use, while Vlow power conductor 84 is powered to a Vlow voltage during use.

Generally speaking, level translator circuit 60 translates a voltage on input conductor 62 to a corresponding voltage on output conductor 66. The voltages conveyed on output conductor 66 range between the Vlow voltage level and the Vhigh voltage level. Vhigh is a voltage level which is greater than or equal to the highest voltage that is conveyed on input conductor 62 or inverted input conductor 64.

Transistor 70 has its gate terminal coupled to input conductor 62, and discharges inverted output conductor 68 to the Vlow voltage level during times when a voltage level on input conductor 62 is greater than Vlow by at least one threshold voltage value. Similarly, transistor 72 has its gate terminal coupled to inverted input conductor 64 and discharges output conductor 66 to the Vlow voltage level during times when a voltage level on inverted input conductor 64 is greater than Vlow by at least one threshold voltage value. Transistor 74 has its gate terminal coupled to inverted output conductor 68 and charges output conductor 66 to the Vhigh voltage level during times when a voltage on inverted output conductor 68 is less than Vhigh by at least one threshold voltage value. Similarly, transistor 76 has its gate terminal coupled to output conductor 66 and charges inverted output conductor 68 to the Vhigh voltage level during times when a voltage on output conductor 66 is less than Vhigh by at least one threshold voltage value.

Together, transistors 70, 72, 74, and 76 provide the translation function from input conductor 62 to output conductor 66 and from inverted input conductor 64 to inverted output conductor 68. Transistors 78 and 80 are provided to speed up the translation of a voltage from an input conductor to a corresponding output conductor. During times of signal transition, transistors 74 and 72 or transistors 70 and 76 may be charging the respective conductor 66 or 68 simultaneously. Since the transistors are charging to dissimilar voltage levels, a conflict exists between the transistors. Transistors 78 and 80 are provided to aid transistors 76 and 74, respectively, during times of signal transition. Transistor 78 aids transistor 76 in driving inverted output conductor 68 high during times when inverted input conductor 64 is at a high voltage. The charging action of transistors 78 and 76 is greater than the discharging action of transistor 70, and inverted output conductor 68 charges more quickly toward Vhigh. Transistor 80 is configured to aid transistor 74 in a similar fashion during times when input conductor 62 is at a high voltage.

The function of level translator 60 will be further illuminated with an example. In the example, input conductor 62 transitions to a relatively high voltage and inverted input conductor 64 transitions to a relatively low voltage. Because input conductor 62 is conveying a voltage greater than Vlow, current begins to flow through transistors 70 and 80. Because inverted input conductor 64 is conveying a relatively low voltage, no electric current flows through transistors 72 and 78. Transistor 70 begins discharging inverted output conductor 68 toward the Vlow voltage level, and transistor 80 begins charging output conductor 66. As the voltage on inverted output conductor 68 decreases, current begins to flow through transistor 74. Transistor 74 continues charging output conductor 66 to a Vhigh voltage level. Output conductor 66 therefore conveys a Vhigh voltage level when input conductor 62 conveys a relatively high voltage level. Also, as the voltage on output conductor 66 rises to the Vhigh level, the current flow through transistor 76 reduces and substantially stops. Therefore, transistor 70 is able to discharge inverted output conductor 68 to the Vlow voltage level. As will be appreciated by those skilled in the art, a relatively low voltage on input conductor 62 and relatively high voltage on inverted input conductor 64 similarly results in a Vlow voltage on output conductor 66 and a Vhigh voltage on inverted output conductor 68.

In one embodiment of input/output driver circuit 20 (shown in FIG. 2), level translator circuit 60 is used as first level translator circuit 22 or as second level translator circuit 24. When used as first level translator circuit 22, input bus 36 represents input conductor 62 and inverted input conductor 64. Also, output conductor 66 and inverted output conductor 68 are indicative of intermediate bus 38. First power conductor 32 is power conductor 82, and second power conductor 34 is power conductor 84. When level translator circuit 60 is used as second level translator circuit 24, second intermediate bus 39 is input conductor 62 and inverted input conductor 64. Also, output conductor 66 is first driver input conductor 42. Third power conductor 40 is power conductor 82, and second power conductor 34 is power conductor 84. Level translator circuit 60 may also be used as third level translator 25 (similar to first level translator 22) or fourth level translator 27 (similar to second level translator 24).

In another embodiment of input/output driver circuit 20, a pair of series-connected inverters are used for first level translator circuit 22, and level translator circuit 60 is used as second level translator circuit 24. The pair of series connected inverters are powered by first power conductor 32 and second power conductor 34 in this embodiment.

Figure 4:
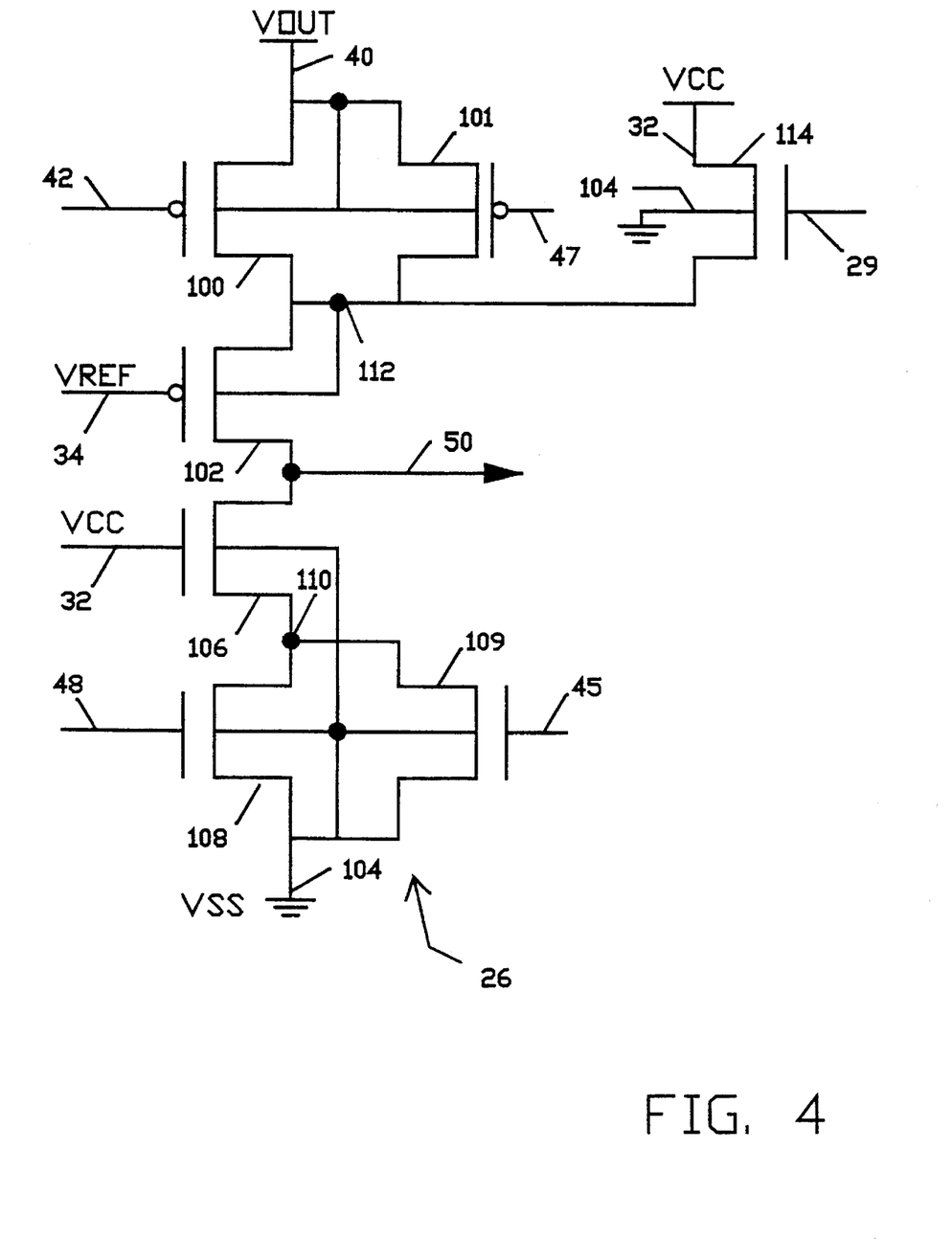
FIG. 4 is a circuit diagram of an output driver circuit according to the present invention.

Turning now to FIG. 4, a circuit diagram of output driver circuit 26 (as shown in block form in FIG. 2) is depicted. Output driver circuit 26 is configured with a parallel-connected pair of PMOS transistors 100 and 101. The parallel-connected pair is series-connected to a PMOS transistor 102. The series connection is formed between third power supply conductor 40 and input/output conductor 50. Coupled between input/output conductor 50 and a ground conductor 104 is an NMOS transistor 106 series-connected to a parallel-connected pair of NMOS transistors 108 and 109. PMOS transistor 100 has a gate terminal connected to first driver input conductor 42, and PMOS transistor 102 has a gate terminal connected to second power supply conductor 34. The gate terminal of NMOS transistor 106 is connected to first power supply conductor 32, while the gate terminal of NMOS transistor 108 is connected to second driver input conductor 48. Additionally, the gate terminal of PMOS transistor 101 is coupled to pullup enable conductor 47 and the gate terminal of NMOS transistor 109 is coupled to pulldown enable conductor 45.

Also depicted in FIG. 4 are the bulk connections of the transistors. Bulk connection of PMOS transistors 100 and 101 to second power supply conductor 40 and bulk connections of NMOS transistors 106, 108, and 109 to ground conductor 104 are the standard bulk connections for PMOS transistors and NMOS transistors in an N-well CMOS technology, respectively. However, PMOS transistor 102 has a bulk connection to a node 112 between PMOS transistors 100 and 101 and PMOS transistor 102. This connection removes the capacitance which normally exists between the source terminal of PMOS transistor 102 and the bulk. In this manner, the capacitance on node 112 is decreased and so switching speed is increased with respect to node 112.

Generally speaking, the driver circuit of FIG. 4 is configured to drive input/output conductor 50 to the Vout voltage provided on third power supply conductor 40 and to the ground voltage level provided on ground conductor 104. In order to prevent hot carrier effects and oxide breakdown from occurring, it is necessary to limit the difference in voltage across any two terminals of transistors 100, 101, 102, 106, 108, and 109 to a maximum allowable voltage defined by the semiconductor technology in which the transistors are fabricated. By providing PMOS transistor 102 and NMOS transistor 106 and connecting their gate terminals as shown, this voltage limitation is provided. In one embodiment, the above mentioned maximum allowable voltage is 3.9 volts.

NMOS transistor 106 provides the voltage limitation by holding the voltage on a node 110 substantially near (i.e. a threshold voltage value less than) the core supply voltage, represented as VCC, during times when second input conductor 48 conveys a ground voltage. If NMOS transistor 106 were not provided, then NMOS transistors 108 and 109 would be connected directly to input/output conductor 50. During times that input/output conductor 50 is conveying a Vout voltage (such as when PMOS transistors 100 and 102 have charged input/output conductor 50), the voltage across the source and drain terminals of NMOS transistors 108 and 109 would be Vout (since NMOS transistors 108 and 109 are connected to ground conductor 104). Since Vout may be larger than the maximum allowable voltage, NMOS transistors 108 and 109 would suffer from hot carrier effects and/or oxide breakdown. However, NMOS transistor 106 is provided. During times when NMOS transistors 108 and 109 are not conducting current, the voltage on node 110 cannot rise above VCC. The voltage on node 110 is limited in this manner due to the threshold voltage of NMOS transistor 106. If the voltage on input/output conductor 50 rises above VCC (for example, to the Vout voltage) and the voltage on node 110 is below VCC, then NMOS transistor 106 conducts current because the voltage on the gate terminal of NMOS transistor 106 is larger than the voltage on its source terminal. As the voltage on node 110 rises to within a threshold voltage of VCC, then NMOS transistor 106 substantially stops conducting current. When either NMOS transistor 108 or 109 is activated via a VCC voltage level on second driver input conductor 48 or pulldown enable conductor 45, NMOS transistor 108 or 109 drains the voltage from node 110. NMOS transistor 106 begins drawing current from output conductor 50, until output conductor 50 is lowered to the ground voltage level. If output conductor 50 is conveying a Vout voltage level when NMOS transistor 108 or 109 is activated, then NMOS transistor 106 may temporarily endure a voltage larger than the maximum allowable voltage. However, this time period is relatively short and so the hot carrier effects which might occur are negligible. Therefore, neither NMOS transistor 106 nor NMOS transistors 108 and 109 is significantly degraded due to hot carrier effects or oxide breakdown while existing in an environment containing voltages larger than the maximum allowable voltage associated with the semiconductor fabrication process used to create NMOS transistors 106, 108, and 109.

NMOS transistor 109 is provided to provide the resistive zero voltage described above. NMOS transistor 109 is fabricated such that its current driving capability is significantly less than PMOS transistor 100. Therefore, NMOS transistor 109 may be activated via a VCC voltage level on pulldown enable conductor 47 during a time interval that a transistor similar to PMOS transistor 100 within a driver circuit external to integrated circuit 10 is activated. The resulting voltage upon input/output conductor 50 will be substantially equal to the Vout voltage during such a time interval. However, during time intervals that PMOS transistor 100 is not activated (as well as other driving high transistors that may be electrically connected to input/output conductor 50), NMOS transistor 109 discharges input/output conductor 50 to a voltage level substantially near the ground voltage. Advantageously, input/output conductor 50 conveys a defined CMOS voltage level during times in which input/output conductor 50 is idle (i.e. not being used to convey a value between integrated circuits).

PMOS transistor 100 and PMOS transistor 102 operate similarly to NMOS transistor 108 and NMOS transistor 106, respectively. However, the gate of PMOS transistor 102 is held at a Vref voltage as opposed to the VCC voltage, and the voltage on node 112 does not fall lower than Vref plus one threshold voltage value. Additionally, PMOS transistor 101 operates similar to NMOS transistor 109. However, PMOS transistor 101 charges input/output conductor 50 to a Vout voltage level when enabled by a relatively low voltage upon pullup enable conductor 47. PMOS transistor 101 is fabricated to have a current driving capability which is substantially less than NMOS transistor 108.

Transistors 100 and 108 are primarily responsible for charging and discharging input/output conductor 50 when activated by combinatorial logic 30. Therefore, transistors 100 and 108 may be referred to as driving transistors. Transistors 102 and 106 are primarily responsible for isolating the transistors of driver circuit 26 from large voltage differences across their various terminals, and may therefore be referred to as isolation transistors. Transistor 101 is often referred to as a pullup transistor, and transistor 109 is often referred to as a pulldown transistor. Additionally, the voltages applied to the gate terminals of transistors 102 and 106 may be referred to as reference voltages, since the voltages upon nodes 110 and 112 are substantially near the gate terminal voltages of transistors 106 and 102 (respectively) when the associated driving transistor and pullup or pulldown transistor are not conducting current.

Additionally included in output driver circuit 26 is an NMOS transistor 114 coupled between first power supply conductor 32 and node 112. NMOS transistor 114 is provided to counter a leakage problem which may occur between node 112 and input/output conductor 50. If input/output conductor 50 is driven to a ground voltage for a long period of time, the voltage upon node 112 may leak to ground. It is noted that leakage currents are a well known attribute of transistors such as CMOS transistors. As node 112 approaches the ground voltage due to leakage currents in the PMOS transistors, the voltage drop across the drain and source terminals of PMOS transistor 100 exceeds the maximum allowable voltage for transistors in the particular CMOS fabrication process if third power supply conductor 40 is charged to 5.0 volts.

In order to prevent the above situation, NMOS transistor 114 is included. The gate terminal of NMOS transistor 114 is coupled to select conductor 29 (shown in FIG. 2). If select conductor 29 is conveying a value indicative of a 5.0 volt charge upon third power supply conductor 40, then NMOS transistor 114 is activated. If select conductor 29 is conveying a value indicative of a 3.3 volt charge (in which case the voltage drops between terminals are within the maximum allowable voltage of the CMOS low voltage process) upon third power supply conductor 40, then NMOS transistor 114 is deactivated.

When NMOS transistor 114 is activated, it provides a relatively low current flow (similar to PMOS transistor 101). The current flow from NMOS transistor 114 serves to maintain the voltage upon node 112 during time periods in which input/output conductor 50 is at a ground voltage. Therefore, node 112 remains at an intermediate voltage between the Vout voltage and ground, and the transistors of output driver circuit 26 are protected from voltage drops larger than a maximum allowable voltage.

Figure 5:
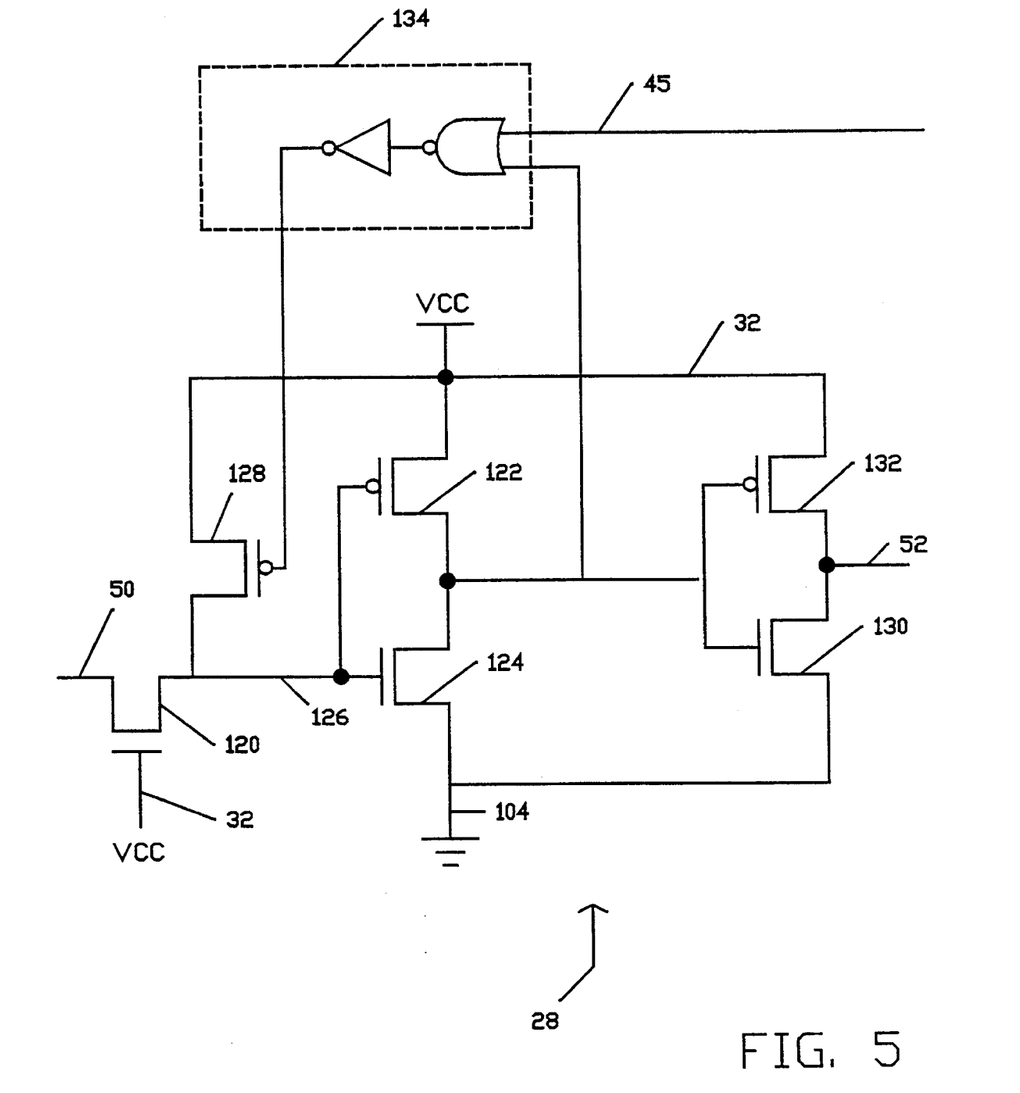
FIG. 5 is a circuit diagram of an input receiver circuit according to the present invention.

Turning now to FIG. 5, a circuit diagram of input receiver circuit 28 is shown. Receiver circuit 28 is coupled to input/output conductor 50 and to received input conductor 52, as well as to first power supply conductor 32 and ground conductor 104. NMOS transistor 120 is coupled between input/output conductor 50 and the gate terminals of transistors 122 and 124. Transistors 122 and 124 are configured as an inverter circuit. The gate terminal of NMOS transistor 120 is coupled to first power supply conductor 32, similar to NMOS transistor 106 in output driver circuit 26 (shown in FIG. 4). Similar to NMOS transistor 106, NMOS transistor 120 limits the voltage conveyed on node 126 to no more than VCC minus one threshold voltage value. Therefore, transistors 122 and 124 are isolated from the Vout voltage level that may be driven on input/output conductor 50. A Vout-tolerant input receiver circuit is thereby formed in a semiconductor technology in which Vout is larger than the maximum allowable voltage of the semiconductor technology.

It is noted that the voltage level on node 126 will not rise completely to the VCC voltage level under the current provided by NMOS transistor 120. NMOS transistor 120 is only capable of charging node 126 to a threshold voltage below VCC. In order to ensure that node 126 rises completely to VCC when output conductor 50 conveys a Vout voltage, input receiver 28 includes PMOS transistor 128. The gate of PMOS transistor 128 is coupled through a logic block 134 to the output node of the inverter circuit formed by transistors 122 and 124. When the inverter circuit begins switching its output node to a logical zero, then voltage on the gate of PMOS transistor 128 drops below VCC and PMOS transistor 128 begins conducting current. Node 126 is thereby charged fully to the VCC voltage level.

Logic block 134 serves to disable PMOS transistor 128 during times in which a pulldown function is active within output driver circuit 26. If logic block 134 were not included and PMOS transistor 128 were directly connected to the output of the inverter circuit, then PMOS transistor 128 may be activated concurrently with the pulldown transistor within the driver circuit. For example, if a logical one value (e.g. a Vout or VCC voltage) were received upon input/output conductor 50, PMOS transistor 128 charges node 126 to the VCC voltage. If the pulldown signal upon pulldown conductor 45 were then activated, pulldown transistor 109 would begin discharging input/output conductor 50. However, PMOS transistor 128 would still be active and would attempt to charge node 126 and hence input/output conductor 50).

Logic block 134 receives the pulldown signal upon pulldown conductor 45. If the pulldown signal is active, then the gate terminal of PMOS transistor 128 is driven to a logical one value (i.e. a VCC voltage). PMOS transistor 128 is inactive, and pulldown transistor 109 discharges input/output conductor 50. If the pulldown signal is inactive, PMOS transistor 128 receives the voltage at the output of the inverter circuit formed by transistors 122 and 124 and thereby charges node 126 to the VCC voltage level.

During a clock cycle in which the pulldown signal is active and a driver circuit other than output driver circuit 26 drives input/output conductor 50 to a logical one value, PMOS transistor 128 is disabled. Therefore, node 126 is not charged fully to the VCC voltage level. However, the difference in the voltage upon node 126 and VCC after NMOS transistor 120 ceases current flow is often less than the threshold voltage of PMOS transistor 122. Therefore, NMOS transistor 124 may discharge the output of the inverter circuit to a voltage substantially near ground and the received value may therefore be interpreted correctly by receiving logic.

Input receiver circuit 28 further includes a second inverter circuit connected to the inverter circuit formed by transistors 122 and 124. The second inverter circuit is formed by transistors 130 and 132. Received input conductor 52 is coupled to the output node of the second inverter circuit. By passing the voltage conveyed on output conductor 50 through two inverter circuits, a signal containing a logic level which is non-inverted from the logic level on input/output conductor 50 is conveyed on received input conductor 52.

It is noted that, while the above discussion describes circuits which perform with a 3.3 volt or 5.0 volt power supply voltage, the present invention is not limited to use with these particular voltage levels. The present circuits include operation at any voltage levels as long as Vout is greater than or substantially equal to VCC and the voltage levels are compatible with the CMOS semiconductor technologies in which the associated integrated circuits are fabricated.

In accordance with the above disclosure, a programmable input/output driver circuit is shown. The input/output driver circuit may be programmed to operate at a variety of power supply voltages. In particular, one embodiment of the input/output circuit may operate at 3.3 volts and 5.0 volts. Advantageously, an integrated circuit employing the present input/output driver circuit may be utilized within an electronic system with other devices which operate at a power supply voltage which is greater than the power supply voltage of the integrated circuit. Additionally, the integrated circuit may achieve power savings and performance gains when employed in a system with devices operating at power supply voltages similar to the power supply voltage of the integrated circuit. The input/output driver circuit shown herein is equipped with pullup and pulldown transistors. The driver circuit may be programmed to pullup or pulldown the input/output conductor when the driver circuit is not actively communicating a value. Advantageously, the input/output conductor is held at a defined voltage level when idle, enabling power savings in the integrated circuit and the devices electrically attached to the input/output conductor.

Numerous variations and modifications will become apparent to those skilled in the art once the above disclosure is fully appreciated. It is intended that the following claims be interpreted to embrace all such variations and modifications.

What is claimed is:

1. An output driver circuit for producing an output voltage programmable to a pair of output voltages, comprising:
   a power supply conductor which is powered, during use, to a power supply voltage;
   an output conductor;
   a driving transistor coupled to said power supply conductor;
   a first transistor coupled in parallel with said driving transistor;
   an isolation transistor coupled in series between said output conductor and said parallel-connected driving transistor and first transistor;
   a reference voltage conductor coupled to a gate terminal of said isolation transistor wherein said reference conductor is powered, during use, to a reference voltage; and
   a first conductor coupled to a gate terminal of said first transistor wherein said first conductor is selectively powered, during use, to one of a pair of voltages.

2. The output driver circuit as recited in claim 1 wherein said power supply voltage is programmable to one of a pair of power supply voltages.

3. The output driver circuit as recited in claim 2 wherein one of said pair of power supply voltages is nominally 5.0 volts.

4. The output driver circuit as recited in claim 2 wherein another of said pair of power supply voltages is nominally 3.3 volts.

5. The output driver circuit as recited in claim 1 wherein said driving transistor, said first transistor, and said isolation transistor are PMOS transistors.

6. The output driver circuit as recited in claim 1 wherein said reference voltage is programmable to one of a pair of reference voltages.

7. The output driver circuit as recited in claim 6 wherein one of said pair of reference voltages is nominally 1.7 volts.

8. The output driver circuit as recited in claim 6 wherein another of said pair of reference voltages is nominally a ground voltage.

9. The output driver circuit as recited in claim 1 wherein one of said pair of voltages is nominally said output voltage.

10. The output driver circuit as recited in claim 1 wherein another of said pair of voltages is nominally said reference voltage.

11. The output driver circuit as recited in claim 1 wherein said driving transistor, said first transistor, and said isolation transistor are NMOS transistors.

12. The output driver circuit as recited in claim 11 wherein said reference voltage is nominally 3.3 volts.

13. The output driver circuit as recited in claim 11 wherein one of said pair of voltages is nominally 3.3 volts.

14. The output driver circuit as recited in claim 11 wherein another of said pair of voltages is nominally a ground voltage.

15. The output driver circuit as recited in claim 11 wherein said power supply voltage is nominally a ground voltage.

16. The output driver circuit as recited in claim 1 further comprising:
   a second power supply conductor;
   a second driving transistor coupled to said second power supply conductor;
   a second transistor coupled in parallel with said second driving transistor;
   a second isolation transistor coupled in series between said output conductor and said parallel-connected second driving transistor and second transistor;
   a second reference voltage conductor coupled to a gate terminal of said second isolation transistor wherein said second reference conductor is powered, during use, to a second reference voltage; and
   a second conductor coupled to a gate terminal of said second transistor wherein said second conductor is selectively powered, during use, to one of a second pair of voltages.

17. An input/output driver circuit for receiving an input voltage and driving an output voltage wherein said input voltage and said output voltage are programable to a pair of voltages, comprising:
   an input/output conductor;
   an output driver circuit coupled to said input/output conductor for driving said output voltage upon said input/output conductor wherein said output driver circuit is selectively powered, during use, with one of a pair of power supply voltages;
   an input receiver circuit coupled to said input/output conductor for receiving said input voltage from said input/output conductor;
   a first level translator circuit, a second level translator circuit, and a selection circuit are operable connected in series to the output driver circuit, wherein said first level translator circuit is configured to translate a first signal having a voltage swing between a first voltage and a second voltage to a second signal having a voltage swing between said first voltage and a third voltage;
   said selection circuit coupled to receive said first signal and said second signal, wherein said selection circuit is configured to select between said first signal and said second signal and to convey a selected signal to said second level translator circuit; and
   said second level translator circuit coupled to receive said selected signal, wherein said second level translator circuit is configured to translate said selected signal to a third signal having a voltage swing between said one of said pair of power supply voltages and said third voltage, and wherein said second level translator circuit is configured to convey said third signal to said output driver circuit.

18. The input/output driver circuit as recited in claim 17 wherein said output driver circuit is configured to receive said third signal and to drive said output conductor to said output voltage if said third signal conveys said third voltage.

19. The input/output driver circuit as recited in claim 17 further comprising a pair of level translator circuits series coupled between an integrated circuit core and said output driver circuit wherein said pair of level translator circuits are configured to translate a first pullup signal having a voltage swing between said first voltage and said second voltage to a second pullup signal having a voltage swing between said third voltage and said one of said pair of power supply voltages, and wherein said output driver circuit is configured to pullup said output conductor to said output voltage if said second pullup signal conveys said third voltage.

20. The input/output driver circuit as recited in claim 17 wherein said selection circuit is a multiplexor.

21. The input/output driver circuit as recited in claim 17 wherein said first voltage is nominally 3.3 volts.

22. The input/output driver circuit as recited in claim 17 wherein said second voltage is nominally a ground voltage.

23. The input/output driver circuit as recited in claim 17 wherein said third voltage is one of a pair of voltages.

24. The input/output driver circuit as recited in claim 23 wherein one of said pair of voltages is nominally 1.7 volts.

25. The input/output driver circuit as recited in claim 23 wherein another of said pair of voltages is nominally a ground voltage.

26. The input/output driver circuit as recited in claim 17 wherein one of said pair of power supply voltages is nominally 5.0 volts.

27. The input/output driver circuit as recited in claim 17 wherein another of said pair of power supply voltages is nominally 3.3 volts.

28. An integrated circuit comprising:

a core section configured to perform a predetermined set of functions; and an input/output section coupled to said core section wherein said input/output section includes a plurality of output driver circuits, wherein each of said output driver circuits includes:

a power supply conductor powered, during use, to one of a pair of power supply voltages;

a ground conductor powered, during use, to a ground voltage;

an output conductor;

a first driving transistor coupled to said power supply conductor;

a pullup transistor coupled in parallel with said first driving transistor;

a first isolation transistor coupled in series between said output conductor and said parallel-connected first driving transistor and pullup transistor;

a second isolation transistor coupled to said output conductor;

a second driving transistor coupled between said second isolation transistor and said ground conductor;

a first reference voltage conductor coupled to a gate terminal of said first isolation transistor wherein said first reference voltage conductor is powered, during use, to a first reference voltage;

a second reference voltage conductor coupled to a gate terminal of said second isolation transistor wherein said second reference voltage conductor is powered, during use, to a second reference voltage; and a pullup conductor coupled to a gate terminal of said pullup transistor wherein said pullup conductor is powered, during use, with one of a pair of pullup voltages.

29. The integrated circuit as recited in claim 28 wherein said each of said plurality of output driver circuit further includes a pulldown transistor coupled in parallel with said second driving transistor and a pulldown conductor coupled to a gate terminal of said pulldown transistor.

30. The integrated circuit as recited in claim 29 wherein said pulldown conductor is powered, during use, with one of a pair of pulldown voltages.

31. The integrated circuit as recited in claim 28 wherein said output driver circuit further includes:

a first level translator circuit configured to translate a first signal having a voltage swing between a first voltage and a second voltage to a second signal having a voltage swing between said first voltage and a third voltage;

a second level translator circuit coupled to a gate terminal of said first driving transistor; and a selection circuit coupled in series between said first level translator circuit and said second level translator circuit, wherein said selection circuit is configured to select between said first signal and said second signal to convey as a selected signal to said second level translator circuit, and wherein said second level translator circuit is configured to translate said selected signal to a third signal upon said gate terminal of said first driving transistor, and wherein said third signal has a voltage swing between said third voltage and said one of said pair of power supply voltages.

32. The integrated circuit as recited in claim 31 wherein said selection circuit is a multiplexor.

33. The integrated circuit as recited in claim 28 wherein said output driver circuit further includes a pair of series-connected level translator circuits, and wherein one of said pair of series-connected level translator circuits is coupled to said pullup conductor, and wherein said pair of series-connected level translator circuits are configured to translate an input signal to a second of said pair of level translator circuits having a voltage swing between said first voltage and said second voltage to a fourth signal upon said pullup conductor having a voltage swing between said third voltage and said one of said pair of power supply voltages.

34. An output driver circuit for producing an output voltage programmable to a pair of output voltages, comprising:

a first power supply conductor which is powered, during use, to a first power supply voltage;

a second power supply conductor which is powered, during use, to a second power supply voltage;

an output conductor;

a driving transistor coupled to said first power supply conductor;

a first transistor coupled in parallel with said driving transistor;

an isolation transistor coupled in series between said output conductor and said parallel-connected driving transistor and first transistor;

a second transistor coupled to said second power supply conductor and further coupled to a node comprising the coupling between said isolation transistor and said parallel-connected driving transistor and first transistor, wherein a gate terminal of said second transistor is selectably powered to said second power supply voltage and to a ground voltage;

a reference voltage conductor coupled to a gate terminal of said isolation transistor wherein said reference conductor is powered, during use, to a reference voltage; and a first conductor coupled to a gate terminal of said first transistor wherein said first conductor is selectively powered, during use, to one of a pair of voltages.

\* \* \* \* \*